(12) United States Patent
Kierys et al.

(10) Patent No.: US 11,861,102 B2
(45) Date of Patent: Jan. 2, 2024

(54) METHOD FOR SETTING A SCANNING FREQUENCY OF A CAPACITIVE TOUCH-SENSITIVE SWITCH, OPERATING METHOD FOR A CAPACITIVE TOUCH-SENSITIVE SWITCH AND CAPACITIVE TOUCH-SENSITIVE SWITCH

(71) Applicant: Diehl AKO Stiftung & Co. KG, Wangen (DE)

(72) Inventors: Krzysztof Kierys, Wroclaw (PL); Adrian Podsiadlowski, Piotrkow Trybunalski (PL)

(73) Assignee: Diehl AKO Stiftung & Co. KG, Wangen (DE)

( * ) Notice: Subject to any disclaimer, the term of this patent is extended or adjusted under 35 U.S.C. 154(b) by 0 days.

(21) Appl. No.: 17/710,196

(22) Filed: Mar. 31, 2022

(65) Prior Publication Data
US 2022/0221973 A1   Jul. 14, 2022

Related U.S. Application Data

(63) Continuation of application No. PCT/EP2019/077138, filed on Oct. 8, 2019.

(51) Int. Cl.
*G06F 3/041* (2006.01)
*G06F 3/044* (2006.01)
*H03K 17/96* (2006.01)

(52) U.S. Cl.
CPC .......... *G06F 3/04166* (2019.05); *G06F 3/044* (2013.01); *H03K 17/962* (2013.01);
(Continued)

(58) Field of Classification Search
CPC ... G06F 3/04166; G06F 3/044; H03K 17/962; H03K 2217/94031; H03K 2217/96073; H03K 2217/960735
See application file for complete search history.

(56) References Cited

U.S. PATENT DOCUMENTS

2009/0303198 A1*  12/2009  Yilmaz .................. G06F 3/044
                                                                      345/173
2011/0261008 A1   10/2011  Joharapurkar et al.
(Continued)

FOREIGN PATENT DOCUMENTS

EP         2680018 A1     1/2014

*Primary Examiner* — Hong Zhou
(74) *Attorney, Agent, or Firm* — Laurence A. Greenberg; Werner H. Stemer; Ralph E. Locher

(57) ABSTRACT

A method for operating a capacitive touch-sensitive switch having a capacitive sensor element and a sensor circuit includes initially setting a scanning frequency of the capacitive touch-sensitive switch with a good signal-to-noise ratio and then operating the capacitive touch-sensitive switch at a scanning frequency which has been set to detect switch actuation. The process of setting the scanning frequency includes operating the touch-sensitive switch using a first measurement method and at a selected scanning frequency, detecting the measurement signals from the sensor circuit and checking whether the detected measurement signals contain or could contain a critical alias effect. If no critical alias effect and no possibility of a critical alias effect are detected during the check, the scanning frequency can be set as the selection frequency for detection operation of the touch-sensitive switch. A capacitive touch-sensitive switch is also provided.

15 Claims, 3 Drawing Sheets

(52) U.S. Cl.
CPC .............. *H03K 2217/96073* (2013.01); *H03K 2217/960735* (2013.01)

(56) References Cited

U.S. PATENT DOCUMENTS

| | | | | |
|---|---|---|---|---|
| 2013/0027333 A1* | 1/2013 | Nagata | ................ | G06F 3/04184 345/173 |
| 2013/0222290 A1* | 8/2013 | Choi | ................... | G06F 3/04184 345/173 |
| 2014/0049266 A1 | 2/2014 | Heim et al. | | |
| 2014/0078099 A1* | 3/2014 | Mo | ..................... | G06F 3/04184 345/174 |
| 2014/0145998 A1* | 5/2014 | Liu | .................... | G06F 3/04182 345/174 |
| 2014/0306722 A1* | 10/2014 | Kim | ................... | G06F 3/04166 324/658 |
| 2014/0362042 A1* | 12/2014 | Noguchi | ............. | G09G 3/3648 345/174 |
| 2015/0234519 A1* | 8/2015 | Gowreesunker | .... | G06F 3/04166 345/174 |
| 2016/0370941 A1* | 12/2016 | Wu | ....................... | G06F 3/0418 |
| 2018/0046323 A1* | 2/2018 | Yang | .................... | G06F 3/0418 |

\* cited by examiner

METHOD FOR SETTING A SCANNING FREQUENCY OF A CAPACITIVE TOUCH-SENSITIVE SWITCH, OPERATING METHOD FOR A CAPACITIVE TOUCH-SENSITIVE SWITCH AND CAPACITIVE TOUCH-SENSITIVE SWITCH

CROSS-REFERENCE TO RELATED APPLICATION

This application is a continuation, under 35 U.S.C. § 120, of copending International Patent Application PCT/EP2019/077138, filed Oct. 8, 2019, which designated the United States; the prior application is herewith incorporated by reference in its entirety.

FIELD AND BACKGROUND OF THE INVENTION

The present invention relates to a method for adjusting a scanning frequency of a capacitive touch-sensitive switch, an operating method for a capacitive touch-sensitive switch having such an adjusting method for the scanning frequency and a capacitive touch-sensitive switch.

In many electrical devices, in particular also in domestic appliances such as stoves, hobs, cooktops, microwave ovens, dishwashers, laundry appliances or the like, touch-sensitive switches which trigger a specific switching operation as a result of a simple touch by a user (so-called touch control) are being used increasingly frequently. In the case of a capacitive touch-sensitive switch, a capacitive sensor element together with the finger of a user forms a capacitance over a touch panel acting as dielectric, which capacitance is variable corresponding to the actuation of the touch-sensitive switch, i.e. the touching or not-touching of a touch panel associated with the capacitive sensor element. The change in the capacitance of the capacitive sensor element as a result of a touch by the user has a corresponding effect on an output signal of the sensor circuit which is correspondingly evaluated by a connected control unit having an evaluation circuit as an actuation of the capacitive touch-sensitive switch. In the case of capacitive touch-sensitive switches, the capacitive sensor element can nevertheless also pick up interference or noise which may result in faulty detections of a switch actuation during the evaluation of the output signals of the sensor circuit.

SUMMARY OF THE INVENTION

It is accordingly an object of the invention to provide a method for setting a scanning frequency of a capacitive touch-sensitive switch, an operating method for a capacitive touch-sensitive switch and a capacitive touch-sensitive switch, which overcome the hereinafore-mentioned disadvantages of the heretofore-known methods and switches of this general type and which improve the operation of a capacitive touch-sensitive switch with which the probability of a faulty detection of a switch actuation can be reduced.

With the foregoing and other objects in view there is provided, in accordance with the invention, a method for adjusting a scanning frequency of a capacitive touch-sensitive switch having a capacitive sensor element and a sensor circuit, the method comprising:

operating the touch-sensitive switch using a first measurement method and at a scanning frequency which has been selected from a group of available scanning frequencies;

detecting measurement signals of the sensor circuit;

checking whether the detected measurement signals contain or could contain a critical alias effect; and setting the scanning frequency as a selection frequency for a detection operating mode of the touch-sensitive switch if no critical alias effect and no possibility of a critical alias effect are identified during the check.

Particularly advantageous configurations and developments of the invention are the subject matter of the dependent claims.

Using this method, a scanning frequency with a good signal-to-noise ratio can be selected and adjusted for the capacitive touch-sensitive switch. The scanning frequency adjusted in this way in particular avoids alias effects caused by noise signal frequencies in the measurement signals of the sensor circuit which would be critical in the evaluation of the measurement signals, i.e. would not be identified as such. By avoiding such critical alias effects, it is possible to reduce the risk of the evaluation of the measurement signals resulting in a faulty detection of an actuation of the touch-sensitive switch. Alias effects which are uncritical in the evaluation of the measurement signals because, for example, they can safely be identified as such do not necessarily need to be avoided, on the other hand, in the case of the adjusted scanning frequency.

In the method according to the invention, not only is a check performed as to whether the measurement signals actually contain an alias effect, i.e. whether an alias effect is identifiable in the measurement signals, but a check is also performed as to whether the measurement signals could contain an alias effect, i.e. whether an alias effect could be present although no alias effect is identifiable in the measurement signals. As a result, the reliability is increased that the scanning frequency adjusted for the detection operating mode of the touch-sensitive switch avoids a critical, i.e. non-identifiable alias effect, as a result of which the probability of a faulty detection of a switch actuation can be reduced.

In one configuration of the invention, the detection of the measurement signals includes generating an amplitude/time graph, and the check as to whether the detected measurement signals contain or could contain a critical alias effect includes converting the generated amplitude/time graph into an amplitude/frequency graph and checking whether the amplitude/frequency graph contains a peak. The conversion of the detected amplitude/time graph into an amplitude/frequency graph preferably takes place by using a fast Fourier transform (FFT).

In one configuration of the invention, if an alias effect is identified during the check as to whether the detected measurement signals contain or could contain a critical alias effect, a further check takes place as to whether the identified alias effect would be critical in the detection operating mode of the touch-sensitive switch and should therefore be eliminated. Depending on the nature of the occurrence of an alias effect, this may be critical or uncritical for the evaluation of the measurement signals. Since touching of the capacitive touch-sensitive switch generates a low-frequency signal, low-frequency alias effects are critical since they cannot be identified as noise, whereas high-frequency alias effects in the measurement signal evaluation can be identified as noise and filtered out.

In the above-described configuration involving a conversion of the generated amplitude/time graph into an amplitude/frequency graph, the check as to whether the identified alias effect would be critical in the detection operating mode of the touch-sensitive switch preferably includes comparing a frequency at which the peak in the amplitude/frequency graph is identified with a threshold value. The threshold value is, for example, a preset frequency value or half the respective scanning frequency.

In addition, in the above-described configuration involving a conversion of the generated amplitude/time graph into an amplitude/frequency graph, the scanning frequency is not set as a selection frequency if no peak is identified during the check as to whether the amplitude/frequency graph contains a peak. However, if no peak is identified at all in the amplitude/frequency graph of the measurement result, it may be that there is no alias effect, but it is also possible that an alias effect exists at a very low-frequency, wherein a peak at a frequency close to zero cannot be identified in the amplitude/frequency graph. Since such a low-frequency alias effect would be critical during the detection operating mode of the touch-sensitive switch because it would not be identifiable as such, in this case as a precaution it is assumed that a critical alias effect could exist at the tested scanning frequency, for which reason this scanning frequency is then, as a precaution, not set as a selection frequency.

In one configuration of the invention, the operation of the touch-sensitive switch, the detection of the measurement signals of the sensor circuit, and the checking of the measurement signals are repeated for a plurality of different scanning frequencies, and one of the plurality of scanning frequencies during the checking of the measurement signals of which neither a critical alias effect nor a possibility of a critical alias effect is identified is set as a selection frequency. If in each case neither a critical alias effect nor a possibility of a critical alias effect is identified during the checking of the measurement signals of a plurality of scanning frequencies, that scanning frequency of this plurality of scanning frequencies which is best suited as a selection frequency is set as selection frequency. A better suitability of a scanning frequency as a selection frequency for the detection operating mode of the touch-sensitive switch is provided, for example, when the alias effect occurs at a higher frequency since this alias effect can then be identified better/more easily/more reliably in comparison with a low-frequency signal generated by touching of the capacitive touch-sensitive switch.

The first measurement method during operation of the touch-sensitive switch is preferably selected from a measurement method having a charge-charge cycle or a discharge-discharge cycle. The terms charge-charge cycle and discharge-discharge cycle relate to the times of the measurement signal detection during the charging or discharging of the capacitance formed by the capacitive sensor element by the sensor circuit.

The operating method according to the invention for a capacitive touch-sensitive switch includes the above-described adjustment of a scanning frequency of the capacitive touch-sensitive switch in accordance with the present invention and an operation of the capacitive touch-sensitive switch at the scanning frequency adjusted in this way for detecting a switch actuation.

The adjustment of the scanning frequency of the capacitive touch-sensitive switch can be performed in an initialization procedure when the capacitive touch-sensitive switch is first brought into operation and/or periodically during the operation of the capacitive touch-sensitive switch.

In one configuration of the invention, the operation of the touch-sensitive switch for detecting a switch actuation is performed by using a second measurement method, which differs from the first measurement method (in the scanning frequency adjustment method). This second measurement method is preferably selected from a measurement method having a charge-discharge cycle or a discharge-charge cycle. The terms charge-discharge cycle and discharge-charge cycle again relate to the times of the measurement signal detection during the charging or discharging of the capacitance formed by the capacitive sensor element by the sensor circuit.

With the objects of the invention in view, there is concomitantly provided a capacitive touch-sensitive switch comprising a capacitive sensor element, a sensor circuit connected to the capacitive sensor element, and a control unit connected to the sensor circuit for driving the sensor circuit, wherein the control unit is configured to execute an above-described operating method of the invention and/or an above-described method for adjusting a scanning frequency of the capacitive touch-sensitive switch in accordance with the invention.

The capacitive touch-sensitive switch of the invention can advantageously be used in operating devices in particular for electronic domestic appliances such as, for example, hobs, cooktops, stoves, dishwashers, laundry appliances or the like.

Other features which are considered as characteristic for the invention are set forth in the appended claims.

Although the invention is illustrated and described herein as embodied in a method for setting a scanning frequency of a capacitive touch-sensitive switch, an operating method for a capacitive touch-sensitive switch and a capacitive touch-sensitive switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
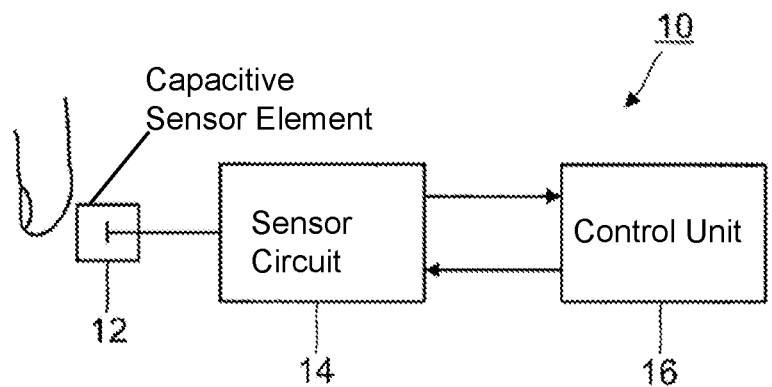
FIG. 1 is a block diagram showing the configuration of a capacitive touch-sensitive switch in accordance with the present invention.

Referring now to the figures of the drawings in detail and first, particularly, to FIG. 1 thereof, there is seen a basic configuration of a capacitive touch-sensitive switch shown in a very simplified way.

The capacitive touch-sensitive switch 10 has in particular a capacitive sensor element 12, for example in the form of an electrode which, together with, for example, a finger of a user and a touch panel acting as a dielectric, for example, of an operating faceplate in between, forms a capacitor having a capacitance which is variable corresponding to the actuation of the touch-sensitive switch 10, i.e. the touching or not-touching of the touch panel associated with the capacitive sensor element 12. The capacitive sensor element 12 is connected to a sensor circuit 14, which detects the changes in capacitance at the sensor element for example during charge or discharge phases of the capacitor.

A control unit 16 is connected to the sensor circuit 14. The control unit 16 drives the sensor circuit 14 in order to switch it on or off, for example, and to preset a scanning frequency for detecting the changes in capacitance for it. The measurement signals detected by the sensor circuit 14 are transmitted to the control unit 16, which evaluates the measurement signals in order to identify touching or not-touching of the touch panel at the capacitive sensor element 12 by a user.

Figure 2:
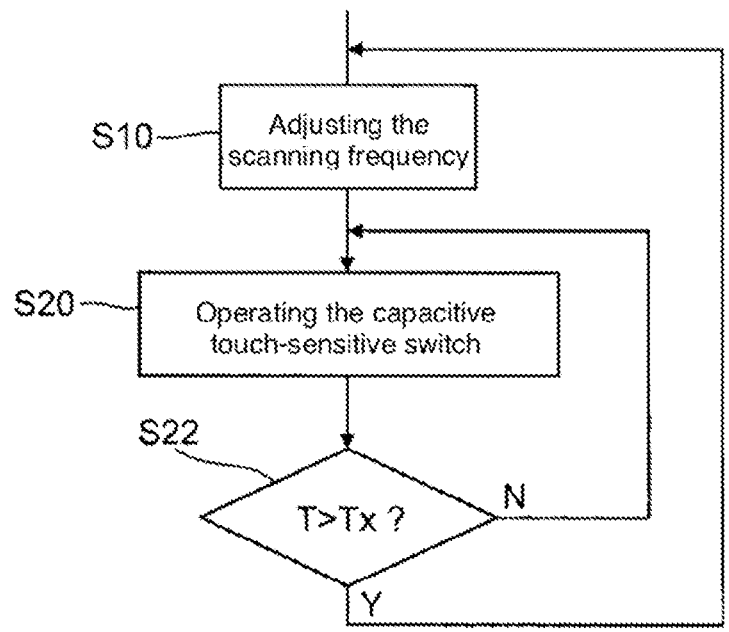
FIG. 2 is a flowchart of an operating method for a capacitive touch-sensitive switch in accordance with one exemplary embodiment of the present invention.

FIG. 2 shows the sequence of an operating method according to the invention for such a capacitive touch-sensitive switch 10.

First, in a step S10, a suitable scanning frequency is adjusted for the sensor circuit 14 of the touch-sensitive switch 10, which scanning frequency offers a good signal-to-noise ratio and avoids critical alias effects as a result of noise signals. Then, in step S20, the capacitive touch-sensitive switch 10 is operated at the scanning frequency fixed in step S10 in order to detect a switch actuation by a user. If the operating duration T of the touch-sensitive switch 10 exceeds a preset limit value Tx (Yes in step S22), step S10 is repeated. In other words, the adjustment of the scanning frequency is repeated periodically at time intervals Tx. This is advantageous since noise signals can change over time and the scanning frequency is then correspondingly adapted. Step S10 of adjusting the scanning frequency is in addition preferably performed in an initialization procedure when the touch-sensitive switch 10 is first brought into operation.

Figure 3:
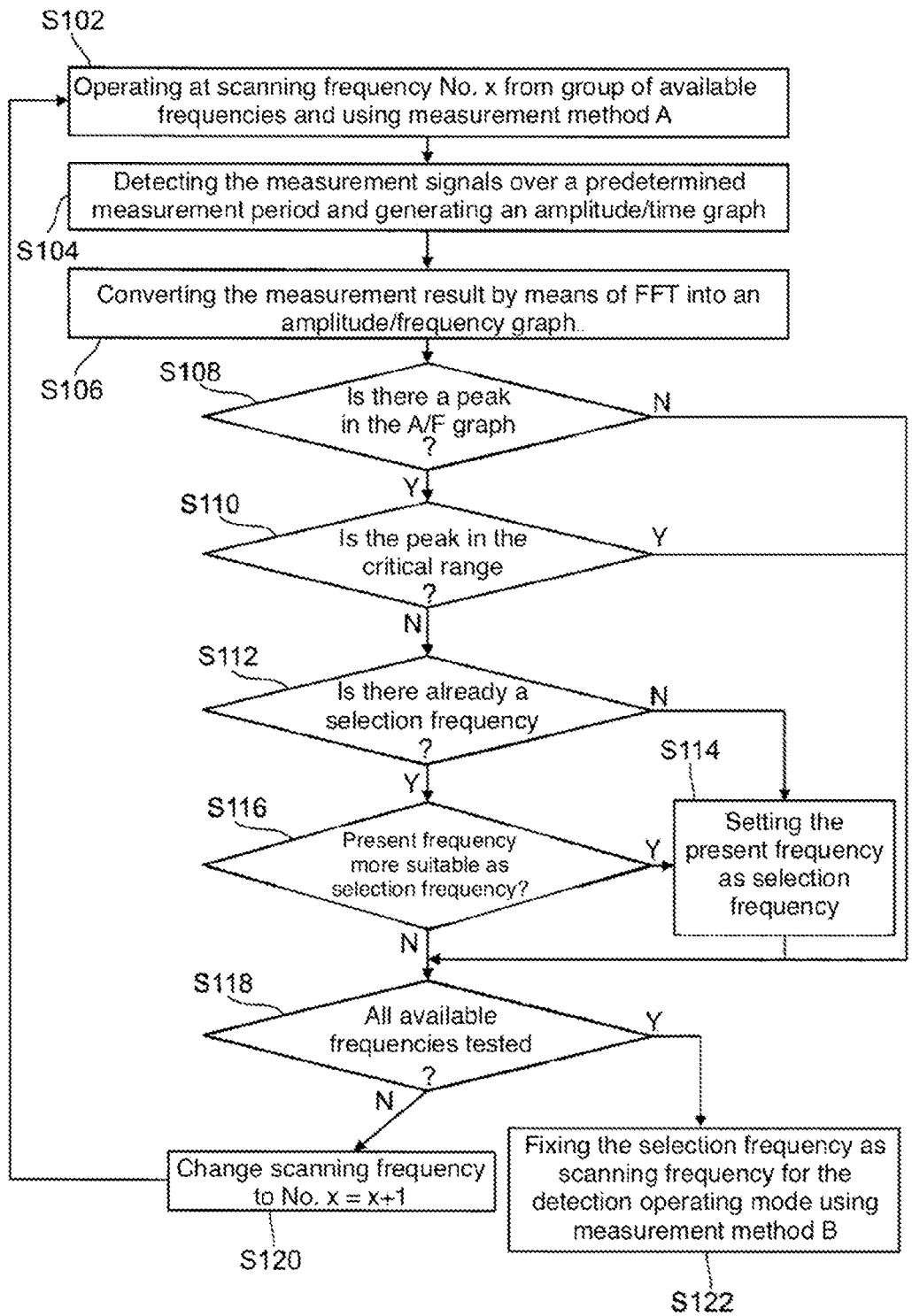
FIG. 3 is a flowchart of a method for adjusting a scanning frequency of a capacitive touch-sensitive switch in accordance with one exemplary embodiment of the present invention.

FIG. 3 shows, by way of example, an exemplary embodiment of the adjustment method from step S10.

In the adjustment method S10, first, in a step S102, the touch-sensitive switch 10 or its sensor circuit 14 is operated at a first scanning frequency (No. x) and using a first measurement method A. The first scanning frequency No. x is selected from a group of available scanning frequencies; the first scanning frequency No. x is, for example, 111 kHz. The first measurement method A is preferably a measurement method having a charge-charge cycle or a measurement method having a discharge-discharge cycle. Then, in a step S104, the corresponding measurement signals are detected by the sensor circuit 14 over a predetermined time period (for example 64 measurements) and a corresponding amplitude/time graph is generated by the control unit 16, as is illustrated by way of example as the top graphs in FIGS. 4A and 4B.

Figure 4A:
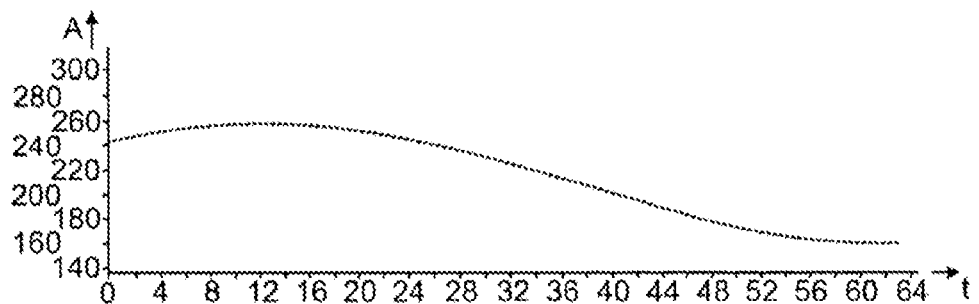
FIGS. 4A and 4B are exemplary amplitude/time graphs and amplitude/frequency graphs for detected measurement signals at different scanning frequencies.
Figure 4B:
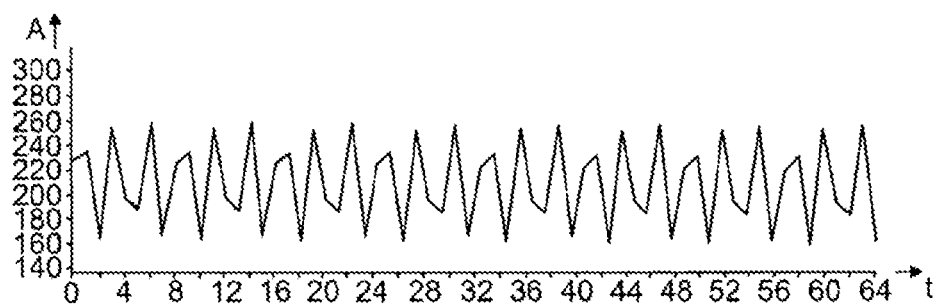

Then, the control unit 16, in a step S106, converts the generated amplitude/time graph into an amplitude/frequency graph by using a fast Fourier transform (FFT), as is illustrated by way of example as the bottom graphs in FIGS. 4A and 4B. The control unit 16 then checks, in a step S108, whether the amplitude/frequency graph contains a peak. Such a peak is caused by an alias effect which is generated by a noise signal.

If the control unit 16 identifies a peak in the amplitude/frequency graph (Yes in S108), the control unit then checks, in a step S110, whether this peak is in the critical range. For example, the control unit 16 checks whether the frequency fp of this peak is below a predetermined threshold value fs. The threshold value fs is, for example, a preset frequency value or half the present scanning frequency.

If the peak in the amplitude/frequency graph is in the critical range below the threshold value fs (Yes in step S110), as is illustrated by way of example in FIG. 4A, the presently tested scanning frequency is not suitable for the detection operating mode of the touch-sensitive switch since this low-frequency alias effect cannot be safely distinguished from a touch of the switch 10 in an evaluation of the measurement signals and is therefore critical. The presently tested scanning frequency is therefore not set as a selection frequency for the detection operating mode of the touch-sensitive switch; instead, the method in this case continues directly with a step S118, explained further below.

If, on the other hand, the peak in the amplitude/frequency graph is in the uncritical range above the threshold value fs (No in step S110), as is illustrated by way of example in FIG. 4B, the presently tested scanning frequency is suitable for the detection operating mode of the touch-sensitive switch since this high-frequency alias effect can be identified as such during an evaluation of the measurement signals and can be distinguished from a touch of the switch 10 which generates a low-frequency measurement signal. The method therefore continues in this case with a step S112.

In step S112, a check is performed as to whether a suitable scanning frequency has already been set as selection frequency in the scanning frequency adjustment method. If this is not the case (No in step S112) because, for example, no suitable scanning frequency has been found yet or because it is the first tested scanning frequency, the method continues with step S114 in order to set the present scanning frequency, which has been judged to be suitable in step S110, as the selection frequency for the detection operating mode of the touch-sensitive switch 10.

If, on the other hand, a selection frequency has already been set in the scanning frequency adjustment method (Yes in step S112), the method continues with a step S116. In this step S116, the control unit 16 compares the suitability of the present scanning frequency with the suitability of the set selection frequency. A scanning frequency is, for example, better suited to the detection operating mode of the touch-sensitive switch 10 when the uncritical alias effect has a higher frequency and therefore generates a peak at a higher frequency fp in the amplitude/frequency graph.

If the previously set selection frequency is better suited than the present scanning frequency (No in step S116), the method continues with the step S118 and the previously set selection frequency remains set as the selection frequency. If, on the other hand, the present scanning frequency is better suited than the previously set selection frequency (Yes in step S116), the method continues with the step S116 in order to reset the present scanning frequency as the selection frequency.

Then, the method (Yes in step S110, No in step S116 or after step S114) continues with the step S118. In this step S118, a check is performed as to whether now all of the available frequencies have been tested in the above-described way for their suitability as scanning frequency for the detection operating mode of the touch-sensitive switch 10. If not all of the available frequencies have yet been tested (No in step S118), the method continues with a step S120, in which the next scanning frequency No. x+1 is selected from the group of available scanning frequencies. The new scanning frequency No. x+1 is, for example, 80 kHz. The method then returns to the step S102 in order to perform the above-described suitability check for the new scanning frequency No. x+1 after step S102. If, on the other hand, all of the available frequencies have now been tested (Yes in step S118), the method continues with a step S122, in which the frequency that was set last as the selection frequency in step S114 is fixed as the scanning frequency for the detection operating mode of the touch-sensitive switch, which is preferably performed by using a second measurement method B, which differs from the first measurement method A.

As is illustrated in FIG. 3, the method in addition goes from step S108 directly to step S118 if no peak is identified in the amplitude/frequency graph. That is to say that although no critical alias effect is identified, the present scanning frequency is not judged as being suitable and in particular is also not set as the selection frequency. The reason for this is that, in this case, it cannot be ruled out that the measurement signals could contain a critical alias effect which, however, is not identifiable in the amplitude/frequency graph. Particularly critical are alias effects with a frequency value fp close to zero or equal to zero. If the alias frequency value fp is equal to zero, the amplitude/frequency graph is, however, flat over the entire frequency range and no peak is identifiable. That is to say that when the control unit 16 does not identify a peak in the amplitude/frequency graph in step S108, this can mean that actually no alias effect is present or alternatively that a critical alias effect is not identifiable.

As mentioned, in the suitability test method S10, a first measurement method A is used, which is preferably a measurement method having a charge-charge cycle or a discharge-discharge cycle. In the detection operating mode of the touch-sensitive switch S20 at the scanning frequency (S122) fixed in the suitability test method S10, a second measurement method B is preferably then used which differs from the first measurement method A. The second measurement method B is preferably a measurement method with a discharge-charge cycle or a charge-discharge cycle.

The invention claimed is:

1. A method for adjusting a scanning frequency of a capacitive touch-sensitive switch having a capacitive sensor element and a sensor circuit, the method comprising:
    operating the touch-sensitive switch by using a first measurement method and at a scanning frequency having been selected from a group of available scanning frequencies;
    detecting measurement signals of the sensor circuit, and carrying out the detection of the measurement signals by including a step of generating an amplitude/time graph;
    checking whether the detected measurement signals contain or could contain a critical alias effect, and carrying out the check as to whether the detected measurement signals contain or could contain a critical alias effect by including a step of converting the generated amplitude/time graph into an amplitude/frequency graph and checking whether the amplitude/frequency graph contains a peak;
    setting the scanning frequency as a selection frequency for a detection operating mode of the touch-sensitive switch when no critical alias effect and no possibility of a critical alias effect are identified during the check; and
    not setting the scanning frequency as the selection frequency when no peak is identified during the check as to whether the amplitude/frequency graph contains a peak.

2. The method according to claim 1, which further comprises:
    repeating the operation of the touch-sensitive switch, the detection of the measurement signals of the sensor circuit and the checking of the measurement signals, for a plurality of different scanning frequencies; and
    setting one of the plurality of scanning frequencies during the checking of the measurement signals of which neither a critical alias effect nor a possibility of a critical alias effect is identified, as the selection frequency.

3. A capacitive touch-sensitive switch, comprising:
    a capacitive sensor element;
    a sensor circuit connected to said capacitive sensor element; and
    a control unit connected to said sensor circuit for driving said sensor circuit, said control unit configured to execute the operating method according to claim 2.

4. The method according to claim 1, which further comprises, when no critical alias effect and no possibility of a critical alias effect are identified in each case during the checking of the measurement signals of a plurality of scanning frequencies, setting a scanning frequency of the plurality of scanning frequencies being best suited as the selection frequency, as the selection frequency.

5. The method according to claim 1, which further comprises selecting the first measurement method from a measurement method having a charge-charge cycle or a discharge-discharge cycle.

6. An operating method for a capacitive touch-sensitive switch, the method comprising:
    adjusting a scanning frequency of the capacitive touch-sensitive switch according to claim 1; and
    operating the capacitive touch-sensitive switch at the adjusted scanning frequency for detecting a switch actuation.

7. The operating method according to claim 6, which further comprises performing the adjustment of the scanning frequency of the capacitive touch-sensitive switch in an initialization procedure at least one of when the capacitive touch-sensitive switch is first brought into operation or periodically during the operation of the capacitive touch-sensitive switch.

8. The operating method according to claim 7, which further comprises performing the operation of the touch-sensitive switch for detecting a switch actuation by using a second measurement method differing from the first measurement method.

9. The operating method according to claim 8, which further comprises selecting the second measurement method from a measurement method having a charge-discharge cycle or a discharge-charge cycle.

10. The operating method according to claim 6, which further comprises performing the operation of the touch-sensitive switch for detecting a switch actuation by using a second measurement method differing from the first measurement method.

11. The operating method according to claim 10, which further comprises selecting the second measurement method from a measurement method having a charge-discharge cycle or a discharge-charge cycle.

12. A capacitive touch-sensitive switch, comprising:
    a capacitive sensor element;
    a sensor circuit connected to said capacitive sensor element; and
    a control unit connected to said sensor circuit for driving said sensor circuit, said control unit configured to execute the method for adjusting the scanning frequency of the capacitive touch-sensitive switch according to claim 1.

13. A method for adjusting a scanning frequency of a capacitive touch-sensitive switch having a capacitive sensor element and a sensor circuit, the method comprising:
operating the touch-sensitive switch by using a first measurement method and at a scanning frequency having been selected from a group of available scanning frequencies;
detecting measurement signals of the sensor circuit;
checking whether the detected measurement signals contain or could contain a critical alias effect;
when an alias effect is identified during the check as to whether the detected measurement signals contain or could contain a critical alias effect, carrying out a check as to whether the identified alias effect would be critical in the detection operating mode of the touch-sensitive switch;
setting the scanning frequency as a selection frequency for a detection operating mode of the touch-sensitive switch when no critical alias effect and no possibility of a critical alias effect are identified during the check; and
not setting the scanning frequency as the selection frequency when no peak is identified during the check as to whether an amplitude/frequency graph contains a peak.

14. The method according to claim 13, which further comprises carrying out the check as to whether the identified alias effect would be critical in the detection operating mode of the touch-sensitive switch by including a step of comparing a frequency at which the peak in the amplitude/frequency graph is identified with a threshold value.

15. A method for adjusting a scanning frequency of a capacitive touch-sensitive switch having a capacitive sensor element and a sensor circuit, the method comprising:
operating the touch-sensitive switch by using a first measurement method and at a scanning frequency having been selected from a group of available scanning frequencies;
detecting measurement signals of the sensor circuit, and carrying out the detection of the measurement signals by including a step of generating an amplitude/time graph;
checking whether the detected measurement signals contain or could contain a critical alias effect, and carrying out the check as to whether the detected measurement signals contain or could contain a critical alias effect by including a step of converting the generated amplitude/time graph into an amplitude/frequency graph and checking whether the amplitude/frequency graph contains a peak;
carrying out the check as to whether an identified alias effect would be critical in the detection operating mode of the touch-sensitive switch by including a step of comparing a frequency at which the peak in the amplitude/frequency graph is identified with a threshold value;
setting the scanning frequency as a selection frequency for a detection operating mode of the touch-sensitive switch when no critical alias effect and no possibility of a critical alias effect are identified during the check; and
not setting the scanning frequency as the selection frequency when no peak is identified during the check as to whether the amplitude/frequency graph contains a peak.

* * * * *